(12) United States Patent
Wakamatsu et al.

(10) Patent No.: US 10,333,030 B2
(45) Date of Patent: Jun. 25, 2019

(54) LIGHT-EMITTING DEVICE INCLUDING REFLECTIVE FILM AND METHOD FOR MANUFACTURING LIGHT-EMITTING DEVICE

(71) Applicant: NICHIA CORPORATION, Anan-shi, Tokushima (JP)

(72) Inventors: Dai Wakamatsu, Anan (JP); Masahiko Sano, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/668,849

(22) Filed: Aug. 4, 2017

(65) Prior Publication Data

US 2018/0040775 A1    Feb. 8, 2018

(30) Foreign Application Priority Data

Aug. 5, 2016  (JP) ................ 2016-154823

(51) Int. Cl.

| | |
|---|---|
| *H01L 33/46* | (2010.01) |
| *F21S 43/14* | (2018.01) |
| *H01L 33/20* | (2010.01) |
| *H01L 33/38* | (2010.01) |
| *H01L 33/50* | (2010.01) |

(Continued)

(52) U.S. Cl.
CPC .............. *H01L 33/46* (2013.01); *F21S 43/14* (2018.01); *H01L 33/20* (2013.01); *H01L 33/38* (2013.01); *H01L 33/50* (2013.01); *H01L 33/502* (2013.01); *H01L 33/62* (2013.01); *H01L 33/405* (2013.01); *H01L 2224/48091* (2013.01); *H01L 2933/0041* (2013.01)

(58) Field of Classification Search
CPC ........ H01L 33/46; H01L 33/20; H01L 33/62; H01L 33/502; H01L 33/38; H01L 33/405; H01L 2224/48091; H01L 2933/0041; F21S 43/14
See application file for complete search history.

(56) References Cited

U.S. PATENT DOCUMENTS

| | | | |
|---|---|---|---|
| 6,340,824 B1 | 1/2002 | Komoto et al. | |
| 6,466,135 B1 * | 10/2002 | Srivastava | ......... C09K 11/7734 257/89 |
| 2002/0079506 A1 | 6/2002 | Komoto et al. | |

(Continued)

FOREIGN PATENT DOCUMENTS

| | | |
|---|---|---|
| JP | 2004040124 A | 2/2004 |
| JP | 2012-510716 A | 5/2012 |

(Continued)

*Primary Examiner* — Tracie Y Green
(74) *Attorney, Agent, or Firm* — Hunton Andrews Kurth LLP

(57) ABSTRACT

A light-emitting device includes a light-emitting element, a phosphor layer, a reflective film, and a light-transmissive member. The light emitting element emits first light. The phosphor layer is provided on a light-emitting surface of the light-emitting element, and contains a phosphor being excited by the first light to emit second light with a wavelength longer than a wavelength of the first light. The reflective film is provided on the phosphor layer, reflects the first light, and transmits the second light. The light-transmissive member is in contact with the reflective film.

15 Claims, 4 Drawing Sheets

(51) Int. Cl.
*H01L 33/62* (2010.01)
*H01L 33/40* (2010.01)

(56) References Cited

U.S. PATENT DOCUMENTS

| | | | |
|---|---|---|---|
| 2002/0088985 A1 | 7/2002 | Komoto et al. | |
| 2004/0116033 A1* | 6/2004 | Ouderkirk | H01L 33/505 445/23 |
| 2007/0114562 A1* | 5/2007 | Radkov | C09K 11/665 257/103 |
| 2010/0072488 A1 | 3/2010 | Bierhuizen et al. | |
| 2010/0090585 A1* | 4/2010 | Seto | C04B 35/16 313/503 |
| 2011/0089458 A1* | 4/2011 | Hartmann | H01L 33/504 257/98 |
| 2011/0220953 A1 | 9/2011 | Bechtel et al. | |
| 2014/0191258 A1 | 7/2014 | Akimoto et al. | |
| 2015/0034990 A1 | 2/2015 | Roitman et al. | |
| 2015/0085467 A1 | 3/2015 | Tsumori et al. | |
| 2015/0140701 A1* | 5/2015 | Peng | H01L 33/507 438/27 |
| 2015/0162503 A1 | 6/2015 | Bechtel et al. | |
| 2015/0184813 A1* | 7/2015 | Harbers | C09K 11/0883 362/84 |
| 2015/0207045 A1* | 7/2015 | Wada | H01L 33/505 257/88 |
| 2016/0003440 A1 | 1/2016 | Wataya et al. | |
| 2016/0027969 A1 | 1/2016 | Denis | |
| 2016/0093777 A1 | 3/2016 | Sato et al. | |
| 2016/0233393 A1* | 8/2016 | Okuno | C09K 11/665 |
| 2016/0254420 A1 | 9/2016 | Denis | |
| 2017/0125649 A1 | 5/2017 | Sato et al. | |
| 2017/0331003 A1* | 11/2017 | Cheng | H01L 33/22 |
| 2018/0198038 A1 | 7/2018 | Sato et al. | |

FOREIGN PATENT DOCUMENTS

| | | |
|---|---|---|
| JP | 2013-065726 A | 4/2013 |
| JP | 2013-098427 A | 5/2013 |
| JP | 2014143344 A | 8/2014 |
| JP | 2014-222705 A | 11/2014 |
| JP | 2015-076527 A | 4/2015 |
| JP | 2015-088220 A | 5/2015 |
| JP | 2015-088483 A | 5/2015 |
| JP | 2015138838 A | 7/2015 |
| JP | 2016-015524 A | 1/2016 |
| JP | 2016-508294 A | 3/2016 |
| JP | 2016072515 A | 5/2016 |

* cited by examiner

LIGHT-EMITTING DEVICE INCLUDING REFLECTIVE FILM AND METHOD FOR MANUFACTURING LIGHT-EMITTING DEVICE

CROSS-REFERENCE TO RELATED APPLICATION

This application claims priority to Japanese Patent Application No. 2016-154823, filed on Aug. 5, 2016, the disclosure of which is hereby incorporated by reference in its entirety.

BACKGROUND

The present disclosure relates to a light-emitting device and a method for manufacturing the light-emitting device.

Light-emitting devices for vehicles including light-emitting diodes (LEDs) have been conventionally known. For example, Japanese Patent Publication No. 2015-88220 and Japanese Patent Publication No. 2015-88483 disclose light-emitting devices for vehicles used for rear lamps and stop lamps for vehicles. The light-emitting devices include blue LEDs that emit blue light, and phosphors that emit light including red components when being irradiated with blue light.

SUMMARY

However, the light-emitting devices disclosed in Japanese Patent Publication No. 2015-88220 and No. 2015-88483 may cause color shift by leaking blue light. Measures for prevention of the blue light leakage to prevent color shift may reduce the light-emission efficiency.

It is an object of the present disclosure to provide a light-emitting device with less color shift while preventing or discouraging reduction in light-emission efficiency.

A light-emitting device in an embodiment according to the present disclosure includes a light-emitting element, a phosphor layer, a reflective film, and a light-transmissive member. The light emitting element emits first light. The phosphor layer is provided on a light-emitting surface of the light-emitting element, and contains a phosphor being excited by the first light, to emit second light with a wavelength longer than a wavelength of the first light. The reflective film is provided on the phosphor layer, reflects the first light, and transmits the second light. The light-transmissive member is in contact with the reflective film.

With the light-emitting device having the above structure in an embodiment according to the present disclosure, a light-emitting device with less color shift, while preventing or discouraging reduction in light-emission efficiency can be provided.

DETAILED DESCRIPTION OF EMBODIMENTS

The following describes a light-emitting device in an embodiment according to the present disclosure with reference to the drawings.

Figure 1:
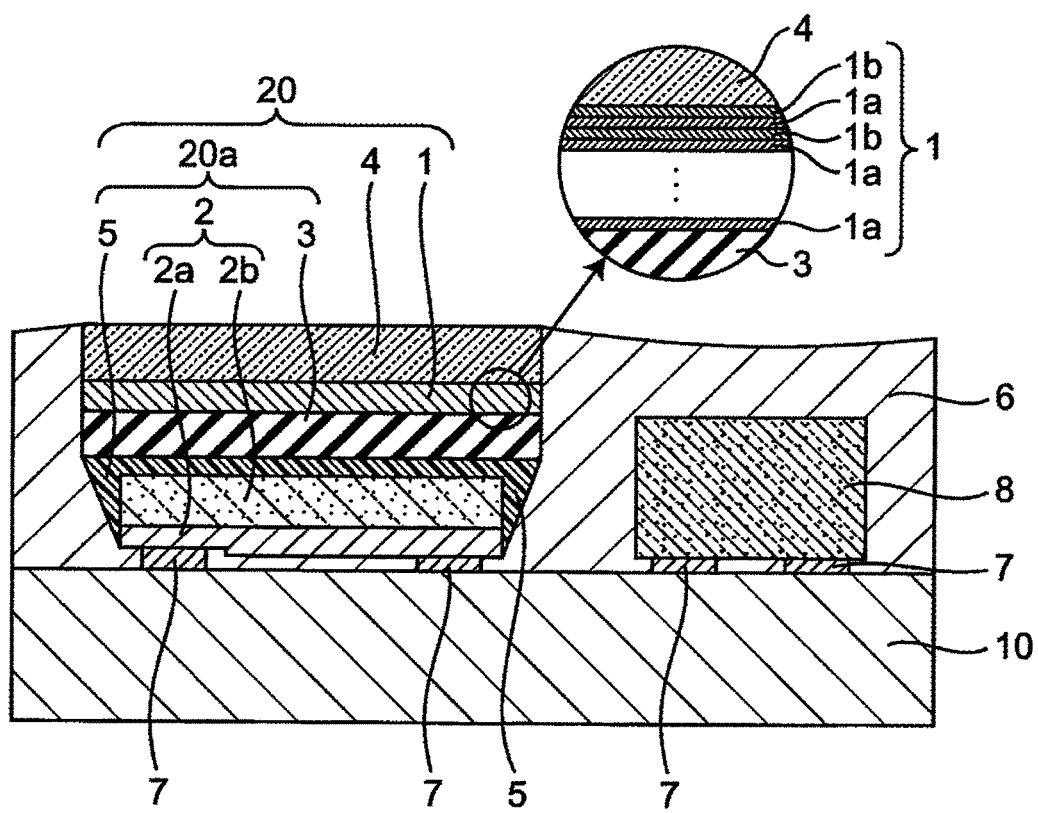
FIG. 1 is a schematic sectional view of a light-emitting device in an embodiment according to the present disclosure.

FIG. 1 is a schematic sectional view of a light-emitting device in an embodiment according to the present disclosure.

The light-emitting device in the embodiment includes a light-emitting layered unit 20 disposed on a mounting board 10. The light-emitting layered unit 20 includes: a light-emitting unit 20a including a light-emitting element 2 and a phosphor layer 3; a reflective film 1, and a light-transmissive member 4. The light-emitting layered unit 20 is covered with a reflective resin 6 on the mounting board 10 except for the surface of the light-transmissive member 4 serving as an emission surface. In particular, in the light-emitting device in the embodiment, the lateral surfaces of the light-emitting unit 20a including the light-emitting element 2 and the phosphor layer 3 are covered with, for example, the reflective resin 6 that reflects substantially all the visible light. The upper surface of the light-emitting unit 20a is covered with the reflective film 1 that transmits second light emitted from the phosphor layer 3 and reflects first light emitted from the light-emitting element 2.

With this structure, the light emitting device can emit light having an emission spectrum substantially the same as an emission spectrum of the second light emitted from a phosphor.

The light-emitting element 2 is disposed on the mounting board 10 with electrically-conductive bonding members 7 sandwiched therebetween and emits the first light such as blue light when a voltage is applied through wirings formed on the mounting board 10.

The phosphor layer 3 is disposed on the light-emitting surface of the light-emitting element 2 and excited by the first light from the light-emitting element 2 to emit the second light with a wavelength longer than the wavelength of the first light. In the present specification, for example, the statement "disposed on an A member" such as "disposed on the light-emitting surface of the light-emitting element 2" includes the case where an object is disposed in contact, with the A member and the case where an object is disposed on the A member with another layer sandwiched therebetween. In the light-emitting device, the phosphor layer 3 is disposed on the light-emitting surface of the light-emitting element 2 with an adhesive layer 5 sandwiched therebetween as shown in FIG. 1.

The reflective film 1 disposed on the phosphor layer 3 reflects the first light emitted from the light-emitting element 2, and transmits the second light emitted from the phosphor layer 3. The reflective film 1 can be made of, for example, a dielectric multilayer film in which first dielectric layers 1a and second dielectric layers 1b having different refractive indice from that of the first dielectric layers are alternately layered. The dielectric multilayer film is allowed to reflect the first light emitted from the light-emitting element 2, and transmit the second light emitted from the phosphor layer 3 by selecting the thicknesses of the first dielectric layers 1a and the second dielectric layers 1b on the basis of the emission spectrum (center wavelength and the intensity distribution over wavelengths) of the first light emitted from the light-emitting element 2, a first refractive index of the first dielectric layers 1a, and a second refractive index of the second dielectric layers 1b.

The light-transmissive member 4 is disposed on and in contact with the reflective film 1. The light-transmissive member 4 is made of, for example, a transparent glass plate in which a surface in contact with the reflective film 1 is flat.

In the light-emitting device in the embodiment, the reflective resin 6 is disposed on the mounting board 10 to cover the light-emitting layered unit 20 except for the surface serving as the emission surface of the light-transmissive member 4. The reflective resin 6 reflects both the first light emitted from the light-emitting element 2 and the second light emitted from the phosphor layer 3.

The light-emitting device of the embodiment may include a semiconductor element 8 such as a protective element for protecting the light-emitting element 2 against breakdowns due to application of excessive voltages as shown in FIG. 1. In this case, the reflective resin 6, for example, covers the semiconductor element 8. The semiconductor element here does not include light-emitting elements.

In the light-emitting device having the above structure, the light-emitting unit 20a including the light-emitting element 2 and the phosphor layer 3 is covered with the reflective resin 6 and the reflective film 1. The reflective resin 6 reflects the first light from the light-emitting element 2 and the second light from the phosphor layer 3. The reflective film 1 reflects the first light and transmits the second light. With this structure, the light emitting device can emit light having an emission spectrum substantially the same as an emission spectrum of the second light emitted from a phosphor.

Figure 3:
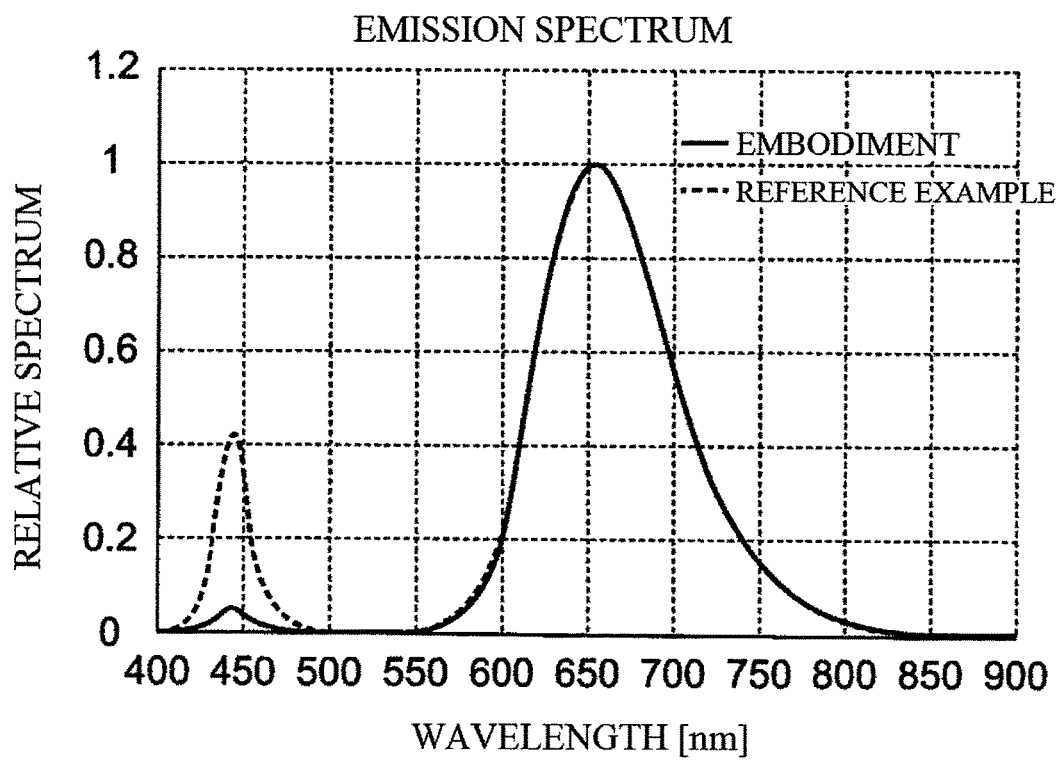
FIG. 3 is a graph showing an emission spectrum of a light-emitting device in an embodiment according to the present disclosure and an emission spectrum of a light-emitting device in a reference example.
Figure 4:
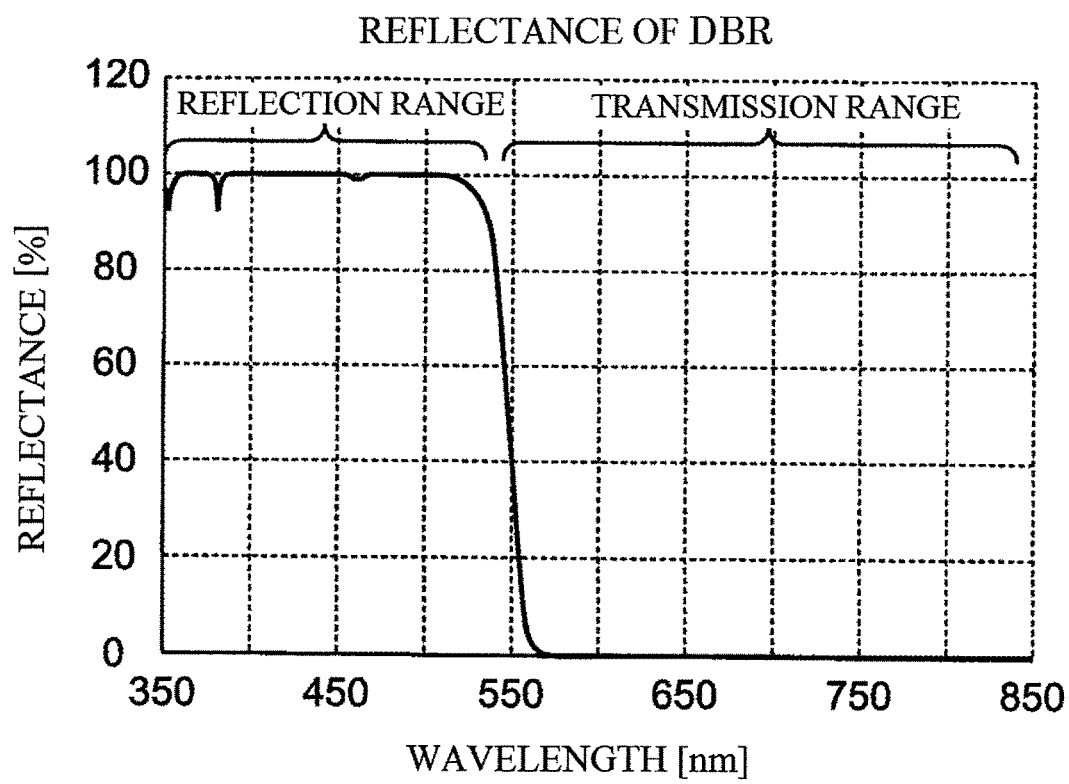
FIG. 4 is a graph of wavelength versus reflectance of a reflective film made of a dielectric multilayer film in a light-emitting device in an embodiment according to the present disclosure, the emission spectrum of which is shown in FIG. 3.

For example, FIG. 3 shows the emission spectrum of the light-emitting device in the embodiment including the light-emitting element 2 that is a blue light-emitting diode, the phosphor layer 3 containing a phosphor that is excited by blue light to emit light in the red wavelength range, and the reflective film 1 made of a dielectric multilayer film that reflects light with wavelengths of 550 nm or less and transmits light with wavelengths of more than 550 nm as shown in FIG. 4. For comparison purpose, FIG. 3 also shows the emission spectrum of a light-emitting device in a reference example having substantially the same structure as the light-emitting device in the embodiment except that the reflective film 1 is not included. The thicknesses of the phosphor layers in the light-emitting device in the embodiment and the light-emitting device in the reference example shown in FIG. 3 are the same. FIG. 4 shows the reflectance for light perpendicularly incident on the dielectric multilayer film (e.g., DBR), and partial transmission of light that is not perpendicularly incident on the dielectric multilayer film.

As shown in FIG. 3, blue light is less likely to be externally emitted to outside the light-emitting device in the embodiment, while in the reference example, blue light is externally emitted to outside the light-emitting device.

The reflective resin 6 and the reflective film 1 cover the light-emitting unit 20a in the light-emitting device of the embodiment, therefore the second light emitted from the phosphor layer 3 is emitted through the reflective film 1, but the first light emitted from the light-emitting element 2 is reflected by the reflective resin 6 and the reflective film 1, is confined to the light-emitting unit 20a, particularly to the phosphor layer 3, and excites the phosphor.

This structure mitigates emission of the first light to outside the light-emitting device, and allows the second light from the phosphor layer 3 to be emitted substantially alone from the light-emitting device, thereby preventing or discouraging color shift.

Figure 2:
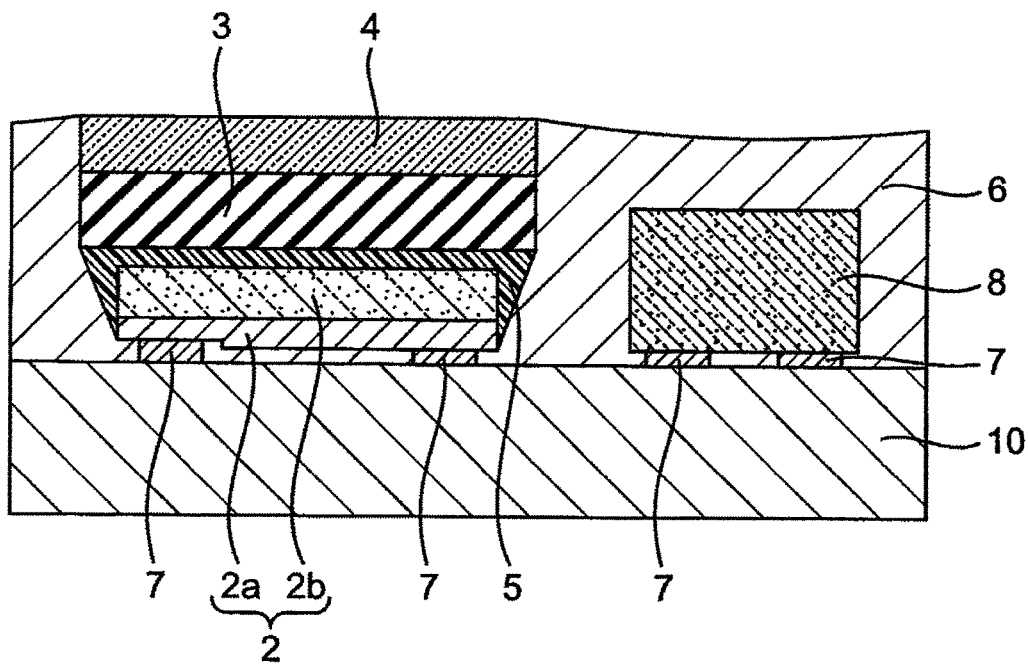
FIG. 2 is a schematic sectional view of a light-emitting device in a reference example.

On the other hand, an attempt to prevent or discourage color shift by, for example, mitigating emission of the first light to outside the light-emitting device without the use of a reflective film requires the phosphor layer 3 to be thick as shown in FIG. 2, which may reduce the emission intensity.

In the light-emitting device in the embodiment, the first light emitted from the light-emitting element 2 is confined to the phosphor layer 3 with little emission of light to the outside, so that the first light can efficiently strike the phosphor, thereby enhancing the light-emission efficiency.

In the light-emitting device in the embodiment, the surface of the light-transmissive member 4 in contact with the reflective film 1 is preferably a flat surface with a surface roughness Ra of preferably 20 nm or less, more preferably 10 nm or less, and further preferably 3 nm or less. With the flat surface of the light-transmissive member 4 in contact with the reflective film 1, for example, the reflective film 1 can be formed flat on the flat surface of the light-transmissive member 4 as described later, and therefore the light-emitting device including the flat reflective film 1 can be provided.

As described above, the light-emitting device in the embodiment efficiently outputs light emitted from the phosphor layer 3 because the first light from the light-emitting element 2 is less likely to be emitted outside the light-emitting device, and the phosphor layer 3 is efficiently excited. Hence, the light-emitting device in the embodiment is suitably used for a vehicle lighting application, such as rear lamps and stop lamps, that includes a blue light-emitting diode that emits light with a comparatively short wavelength and at least one phosphor that is excited by blue light and emits light with a comparatively long wavelength, such as amber to red light that is then emitted from the light-emitting device. In the case where t he light-emitting device in the embodiment emits red light, specifically, the chromaticity of the emitted light is preferably within the quadrilateral region formed by connecting the four points (x=0.645, y=0.335). (x=0.665, y=0.335), (x=0.735, y=0.265), and (x=0.721, y=0.259) in the xy chromaticity coordinate system in the CIE 1931 chromaticity diagram.

To improve the light-emission efficiency, in the case where the light-emitting device in the embodiment is used as, for example, a rear lamp or a stop lamp for a vehicle, the light-emitting device is designed to emit light in a range of, for example, 555 nm to 600 nm, in which the spectral luminous efficacy is high, while the chromaticity of the emitted light is kept within the above quadrilateral region in the CIE 1931 chromaticity diagram. Specifically, the constitution is selected so that the emission intensity of the light in a range of 555 nm to 600 nm is, for example, 0.1 times or more as large as the emission intensity at the peak wavelength. To achieve a higher emission intensity of the light in a range of 555 nm to 600 nm, in which the spectral luminous efficacy is high, the lower-limit wavelength of the transmission range of the dielectric multilayer film is set at short wavelength side to the extent that the reflectance for light from the light-emitting element is not reduced, or a phosphor that emits light comparatively rich in components in a range of 555 nm to 600 nm is used.

For example, in the case where a dielectric multilayer film is used in the light-emitting device in the embodiment as the reflective film 1, light perpendicularly incident on the dielectric multilayer film is substantially completely reflected, but non-perpendicular light is partially transmitted as described above. To reduce emission of the non-perpendicular light to the outside, it is possible to increase the thickness of the phosphor layer 3 to reduce the amount of light entering the dielectric multilayer film from the light-emitting element 2, that is, to make much of the light from the light-emitting element 2 be absorbed into the phosphor before reaching the dielectric multilayer film and excite the phosphor. As a comparison between Example 1 and Example 2 described later reveals, however, the thicker the phosphor layer 3 is, the lower the emission intensity is. Hence, it is preferable to increase the thickness of the phosphor layer 3 to the extent that light emitted from the light-emitting element 2 is allowed to exit to the outside to increase the emission intensity in the light-emitting device of the embodiment. Specifically, in the emission spectrum of the light-emitting device, the emission peak intensity of the light emitted from the light-emitting element 2 is ¹⁄₁₀ or less, more preferably ¹⁄₁₅ or less, of the emission peak intensity of the light emitted from the phosphor in order to suppress color shift, and the emission peak intensity of the light emitted from the light-emitting element 2 is ¹⁄₃₀ or more, more preferably ¹⁄₂₀ or more of the emission peak intensity of the light emitted from the phosphor in order to increase the emission intensity.

The following describes constituent members of the light-emitting device in the embodiment in detail.

Mounting Board

Preferably, the mounting board 10 is insulative, and does not transmit light or transmits little light. Examples of the material of the mounting board 10 include: ceramics such as alumina and aluminum nitride; and resins such as phenolic resins, epoxy resins, polyimide resins, BT resin, and polyphthalamide. Among these materials, ceramics are preferable because of their high heat dissipation. In the case where a resin is used, an inorganic filler such as glass fiber, silicon oxide, titanium oxide, and alumina may be mixed with the resin as appropriate. Such a filler can improve the mechanical strength, reduce the thermal expansion coefficient, and improve the light reflectance. The light-emitting device in the embodiment may not include the mounting board 10. In this case, the electrodes of the light-emitting element, or electrically-conductive members electrically connected with the electrodes of the light-emitting element are preferably exposed on the lower surface of the light-emitting device to serve as external electrodes of the light-emitting device. In the case where the protective element is used, the electrodes of the light-emitting element are connected in anti-parallel with the electrodes of the protective element via the electrically-conductive members. In this case, wirings can be formed by plating or the like on the lower surface of the light-emitting device.

Light-Emitting Element

The light-emitting element 2 is used for exciting the phosphor contained in the phosphor layer 3. For example, a light-emitting diode (i.e., LED) chip or a laser diode (i.e., LD) chip can be used as the light-emitting element 2, and use of an LED chip is particularly preferable. Use of a light-emitting diode chip as the light-emitting element 2 facilitates spreading of light from the light-emitting element 2, thereby enabling the phosphor to be efficiently excited. For example, a light-emitting diode chip that contains a nitride semiconductor and emits blue light is used as the light-emitting element 2. The light-emitting diode chip that emits blue light here means a chip that has an emission peak wavelength in a range of 435 nm to 480 nm.

A nitride semiconductor here may be a semiconductor represented by the general formula $In_XAl_YGa_{1-X-Y}N$ ($0 \leq X$, $0 \leq Y$, $X+Y \leq 1$), and its emission wavelength can be variously selected by changing the composition and mixing ratio of the semiconductor layer. The light-emitting element 2 including a nitride semiconductor may include, for example, a growth substrate 2b made of sapphire or the like on which a nitride semiconductor can be grown, and a semiconductor layered body 2a disposed on the growth substrate 2b.

A p-electrode and an n-electrode are disposed on the semiconductor layered body 2a in the light-emitting element 2. The light-emitting element 2 preferably has the p-electrode and the n-electrode formed on the same surface of the light-emitting element 2 and is flip-chip mount ed on the mounting board 10 as shown in FIG. 1. This structure allows the upper surface (light-emitting surface) of the light-emitting element 2 to be flat and enables the phosphor layer 3 to be closely disposed on or above the light-emitting element 2. In FIG. 1, the light-emitting element 2 includes the growth substrate 2b, but the growth substrate 2b may be removed at the time of mounting or after mounting.

Phosphor Layer

The phosphor layer 3 absorbs the first light from the light-emitting element 2 and re-emits light with a different wavelength.

In the present embodiment, the phosphor layer 3 is formed by, for example, printing a light-transmissive resin paste containing phosphor particles on the surface of the light-transmissive member with the reflective film 1 sandwiched therebetween. The phosphor layer 3 may be a single layer or multiple layers. The phosphor layer 3 may contain a diffusing agent as appropriate.

The average diameter of the phosphor particles contained in the resin is preferably 2 μm to 40 μm, more preferably 10 μm to 40 μm, and further preferably 15 μm to 40 μm.

Provided that the total volume of the phosphor particles contained in the resin is uniform, when the particles each have a small diameter, surface area becomes large in total particles, thereby promoting scatter of light emitted from a phosphor particle by other phosphor particles, and reducing the light extraction efficiency. On the other hand, when the particles each have a large diameter, scattering is reduced and the light extraction efficiency is increased, however the large diameter provides small surface area in total particles, resulting in reduction in the amount of light emitted from the phosphor, and increase in the amount of light that does not undergo wavelength conversion. Since light that has reached the phosphor layer without undergoing wavelength conversion is directed back to the phosphor layer by the reflective film 1 in the present embodiment, using phosphor particles having a large diameter enables efficient wavelength conversion of light from the light-emitting element while reducing scatter on t he surfaces of the particles. Hence, in the light-emitting device of the embodiment, the large diameter of the phosphor particles enables efficient wavelength conversion of light from the light-emitting element and improves the light extraction efficiency.

The average diameter of the phosphor particles in the present specification means the average diameter of secondary particles formed through aggregation of primary particles. The average diameter (median diameter) of the secondary particles can be measured with, for example, a laser-diffraction particle size analyzer (manufactured by Malvern Instruments, product name: Mastersizer 3000).

The thickness of the phosphor layer 3 is 30 μm to 150 μm, preferably 50 μm to 120 μm.

For example, a nitride phosphor can be combined with a light-emitting diode that emits near-ultraviolet to blue light to obtain a light-emitting device used for a rear lamp or brake lamp for a vehicle.

The nitride phosphor is a phosphor containing at least one Group II element selected from the group consisting of Be, Mg, Ca, Sr, Ba, and Zn; at least one Group IV element selected from the group consisting of C, Si, Ge, Sn, Ti, Zr, and Hf; and N, and activated by at least one rare earth element selected from the group consisting of: Y, La, Ce, Pr, Nd, Sm, Eu, Gd, Tb, Dy, Ho, Er, and Lu. The composition of this nitride phosphor may include O.

Specific examples of the nitride phosphor include phosphors represented by the general formula $L_X M_Y N_{(2/3)X+(4/3)Y}$:R or $L_X M_Y O_Z N_{(2/3)X+(4/3)Y-(2/3)Z}$:R (where L is at least one group II element selected from the group consisting of Be, Mg, Ca, Sr, Ba, and Zn; M is at least one group IV element selected from the group consisting of C, Si, Ge, Sn, Ti, Zr, and Hf; R is at least one rare earth element selected from the group consisting of Y, La, Ce, Pr, Nd, Sm, Eu, Gd, Tb, Dy, Ho, Er, and Lu: and X, Y and Z are $0.5 \leq X \leq 3$, $1.5 \leq Y \leq 8$, and $0 < Z \leq 3$).

More specific examples of the nitride phosphor include CASN-based phosphors typified by $CaAlSiN_3$:Eu and SCASN phosphors typified by $(Sr,Ca)AlSiN_3$:Eu. Besides the nitride phosphors, KSF ($K_2 SiF_6$:Mn) phosphors and sulfide phosphors can be used.

Furthermore, a light-emitting device that emits amber light can be made by combining a blue light-emitting diode with at least one phosphor containing a YAG phosphor and at least one phosphor that emits light rich in red components, such as nitride-based phosphors, KSF-based phosphors, and sulfide phosphors.

The above has described an example in which the phosphor layer 3 is formed by printing the light-transmissive resin paste containing the phosphor particles. The phosphor layer 3 may be formed, however, by forming a film of a light-transmissive material such as glass and inorganic substances that contains the phosphor. FIG. 1 shows the embodiment in which the phosphor layer 3 is in direct contact with the surface of the reflective film 1, but the phosphor layer is not necessarily in direct contact with the surface of the reflective film 1 but may be bonded with another member such as an adhesive. For example, a plate-shaped phosphor plate may be compressed, fusion-bonded, sintered, bonded with an organic adhesive, or bonded with an inorganic adhesive such as low-melting-point glass.

Reflective Film

A dielectric multilayer film with high selectivity is preferably used as the reflective film.

The high selectivity here means that the reflectance in the reflection wavelength range is high, the transmittance in the transmission wavelength range is high, and the reflectance or the transmittance abruptly changes around the border between the reflection wavelength range and the transmission wavelength range.

Dielectric Multilayer Film

The dielectric multilayer film is a reflective film having two types of dielectric layers, which are the first dielectric layers 1a and the second dielectric layers 1b, with different refractive indices each having a thickness of λ/4 are alternately and periodically formed. Here, λ refers the peak wavelength in a wavelength range to be reflected and is a wavelength in each medium, that is, in each dielectric material. The dielectric multilayer film is known to provide a higher reflectance theoretically when the difference in refractive indices between the two types of dielectric layers, which are the first dielectric layers 1a and the second dielectric layers 1b, is larger, and when the number of periods of alternate formation is larger. In the case where the difference in refractive indices between the two types of dielectric layers, which are the first dielectric layers 1a and the second dielectric layers 1b, or the number of periods of alternate formation is too large, however, it is difficult to stably obtain a desired reflectance in a desired wavelength range because the reflectance sharply decreases on both sides of the reflection peak wavelength λ (wavelength dependence becomes abrupt) or because the wavelength dependence of the reflectance is large. To address the above, the refractive indices, the difference in refractive indices, and the number of periods of alternate formation of the first dielectric layers 1a and the second dielectric layers 1b in the dielectric multilayer film are selected as appropriate so that a desired reflectance is stably obtained in a desired wavelength range. The first dielectric layers 1a are made of a dielectric material with a high refractive index. The second dielectric layers 1b are made of a dielectric material with a low refractive index.

Specifically, the refractive index of the first dielectric layers 1a with a high refractive index (referred to as first refractive index) is, for example, in a range of 1.5 to 3.0, preferably in a range of 2.0 to 2.6. The refractive index of the second dielectric layers 1b with a low refractive index (referred to as second refractive index) is, for example, in a range of 1.0 to 1.8, preferably in a range of 1.2 to 1.6. Also, the number of periods of alternate formation of the first dielectric layers 1a and the second dielectric layers 1b is, for example, in a range of 1 to 20, preferably in a range of 1 to 5.

The dielectric material constituting the first dielectric layers 1a can be selected from, for example, $TiO_2$, $Nb_2O_5$, $Ta_2O_5$, and $Zr_2O_5$. The dielectric material constituting the second dielectric layers 1b can be made of a material selected from, for example, $SiO_2$, $Al_2O_3$, and SiON.

Light-Transmissive Member

The reflective film 1 and the phosphor layer 3 are disposed on one surface of the light-transmissive member 4, and are supported by the light-transmissive member 4. A plate-shaped body made of a light-transmissive material such as glass and resins can be used as the light-transmissive member 4. The glass can be selected from, for example, borosilicate glass and quartz glass. The resin can be selected from, for example, silicone resins and epoxy resins. The light-transmissive member 1 can be thick enough not to decrease in the mechanical strength during the manufacturing process, and enough to impart sufficient mechanical strength to the phosphor layer 3. The light-transmissive member 4 may contain a diffusing agent. Examples of the diffusing agent include titanium oxide, barium titanate, aluminum oxide, and silicon oxide. The upper surface, surface opposite to the surface on which the reflective film 1 and the phosphor layer 3 are disposed, which serves as the light-emitting surface, of the light-transmissive member 4 is not limited to a flat surface but may have minute irregularities. The irregularities in the light-emitting surface enable scattering light emitted from the light-emitting surface, thereby reducing unevenness in luminance and color.

Adhesive Layer

The adhesive layer 5 bonds the light-emitting element 2 to the phosphor layer 3. The adhesive layer 5 is preferably made of a material that can guide light emitted from the light-emitting element 2 to the phosphor layer 3 with as little attenuation as possible. Specific examples include organic resins such as epoxy resins, silicone resins, phenolic resins, and polyimide resins, and silicone resins are preferable. The thickness of the adhesive layer is preferably as small as possible. A thin adhesive layer reduces losses of light transmitted through the adhesive layer, and improves the heat dissipation performance. Accordingly, the intensity of light emitted from the light-emitting device can be enhanced.

The adhesive layer 5 preferably exists not only between the light-emitting element 2 and the phosphor layer 3, but also on the lateral surfaces of the light-emitting element 2. In the case where a silicone resin is used as a binder in the phosphor layer 3, a silicone resin is preferably used also in the adhesive layer 5 as an adhesive. This structure reduces the difference in refractive indices between the phosphor layer 3 and the adhesive layer 5, thereby increasing light entering the phosphor layer 3 from the adhesive layer 5.

Protective Element

The protective element protects the light-emitting element 2 against breakdowns and degradation of performance due to application of excessive voltages. For example, the protective element can employ a Zener diode, which conducts electricity when a voltage equal to or more than a set voltage is applied. The protective element and the light-emitting element 2 each may be a semiconductor element including a p-electrode and an n-electrode. The protective element is connected in anti-parallel with the p-electrode and the n-electrode of the light-emitting element 2, that is, the n-electrode and the p-electrode of the light-emitting element 2 are electrically connected respectively to the p-electrode and the n-electrode of the protective element via the electrically-conductive bonding members 7. As in the case of the light-emitting element, the electrically-conductive bonding members are bonded to the protective element by applying heat, ultrasonic waves, and a load with the electrodes of the protective element facing the corresponding electrically-conductive bonding members.

This structure keeps the voltage between p- and n-electrodes of the light-emitting element 2 to the Zener voltage of the Zener diode and prevents the voltage between the electrodes from exceeding the Zener voltage even when an excessive voltage larger than the Zener voltage is applied between the p- and n-electrodes of the light-emitting element 2. Accordingly, providing the protective element prevents the voltage between the p- and n-electrodes from exceeding the Zener voltage, and appropriately prevents breakdowns and performance degradation of the light-emitting element 2 due to application of excessive voltages.

The height of the semiconductor element in mounting is preferably smaller than the total height of the light-emitting element, the phosphor layer, and the light-transmissive member. This is because the outer shape of the semiconductor element raises the outermost surface of the reflective resin, and reduces formation of sink.

Reflective Resin

An insulating material is preferably used for the reflective resin 6. To ensure strength to some extent, for example, a thermosetting resin or a thermoplastic resin can be used. More specific examples include phenolic resins, epoxy resins, BT resin, PPA, and silicone resins. To increase the reflection efficiency of light, a base member of resin can contain powder of a reflective member (e.g., $TiO_2$, $Al_2O_3$, $ZrO_2$, and MgO), dispersed therein. The powder of a reflective member may be less likely to absorb light from the light-emitting element 2, and may largely differ in refractive index from the base material of resin. For example, the concentration of the reflective member is preferably 30wt % or more, and its thickness is preferably 20 μm or more, more preferably 100 μm or more.

The reflective resin 6 can be charged using, for example, a resin discharging device that can move (movable) vertically or horizontally with respect to the mounting board 10 on the upper surface of the secured mounting board 10. That is, the reflective resin 6 is injected around the light-emitting element 2 and the semiconductor element 8 by moving the resin discharging device filled with the resin while discharging liquid-state resin from the nozzle at the tip of discharging device. The moving speed of the resin discharging device can be adjusted as appropriate in accordance with the viscosity and temperature of the resin to be used. The discharge quantity can be adjusted by maintaining the pressure or the like applied during discharging constant. The viscosity of the reflective resin is in a range of 0.35 Pa·s to 13.0 Pa·s, preferably in a range of 3.0 Pa·s to 5.5 Pa·s at room temperature (20±5° C.).

Electrically-Conductive Bonding Members

Bumps made of Au or its alloy can be used as the electrically-conductive bonding members 7, and examples of other electrically-conductive bonding members include eutectic solder (e.g., Au—Sn), Pb—Sn, and Pb-free solder. FIG. 1 shows an example in which bumps are used as the electrically-conductive bonding members 7, but the electrically-conductive bonding members 7 are not limited to bumps but may be formed of, for example, an electrically-conductive paste.

A method for manufacturing the light-emitting device in the embodiment will be described below.

Figure 5A:
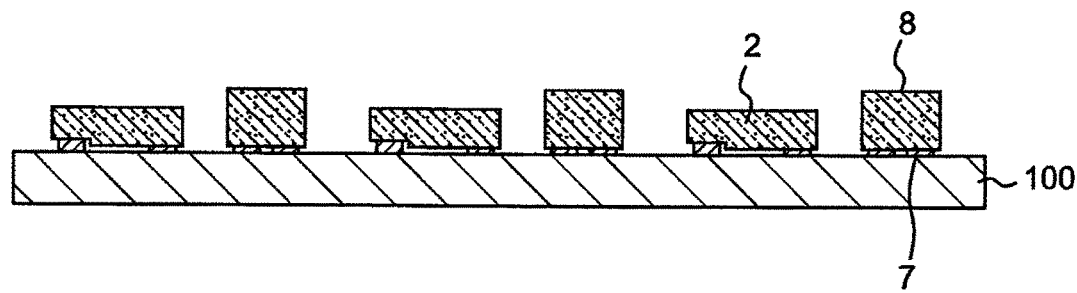
FIG. 5A is a diagram illustrating a state where a plurality of light-emitting elements 2 are disposed on a mounting board block 100 in a method for manufacturing the light-emitting device in an embodiment according to the present disclosure.
Figure 5B:
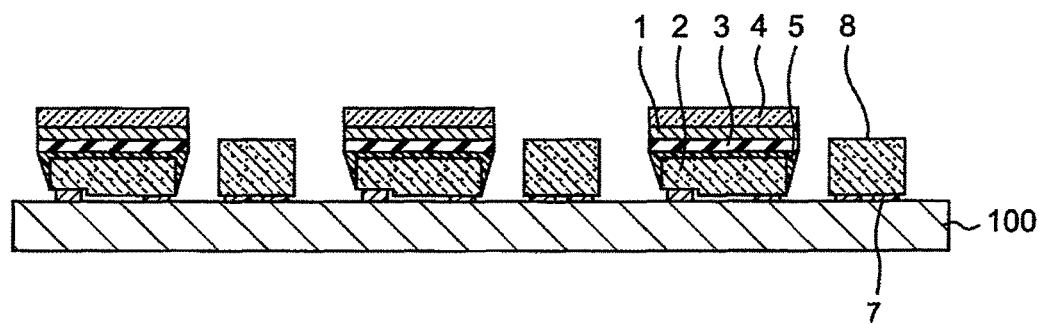
FIG. 5B is a diagram illustrating a state where light-transmissive layered members are bonded to the light-emitting elements 2 with adhesive layers 5 in a method for manufacturing the light-emitting device in an embodiment according to the present disclosure.
Figure 5C:
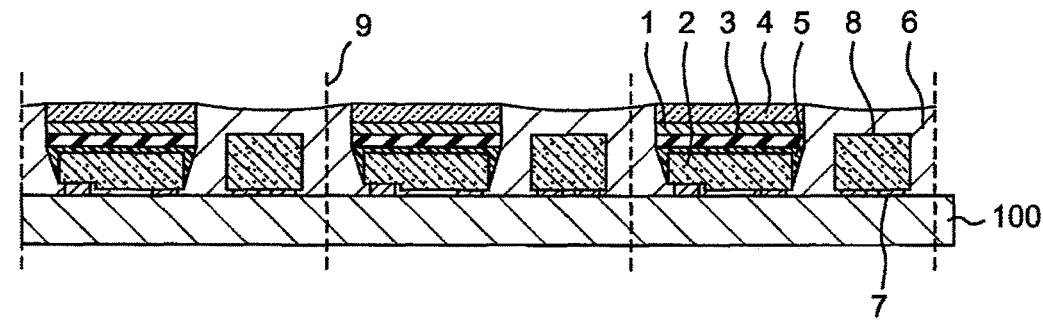
FIG. 5C is a diagram illustrating a state where a reflective resin is charged into gaps between adjacent light-emitting layered units in a method for manufacturing the light-emitting device in an embodiment according to the present disclosure.

As shown in FIG. 5A to FIG. 5C, a method for manufacturing the light-emitting device according to an embodiment according to the present disclosure includes (1) a first step of disposing the light-emitting elements on a mounting board, (2) a second step of forming the reflective films 1 and the phosphor layers 3 on the light-transmissive members, (3) a third step of disposing the light-transmissive members 4 on the light-emitting elements 2 to produce the light-emitting layered units 20, the light-transmissive members 4 each being formed through dividing after the second step and provided with the reflective films 1 and the phosphor layers 3, and (4) a fourth step of filling the gaps between the adjacent light-emitting layered units 20 with the reflective resin to form the reflective resin embedding the semiconductor elements 8 and covering the lateral surfaces of the light-emitting layered units 20.

First Step

In the first step, a plurality of light-emitting elements 2 are disposed on a mounting board block 100 as shown in FIG. 5A. The semiconductor elements 8 are disposed between the adjacent light-emitting elements in the row or column direction of the arranged light-emitting elements 2. The light-emitting elements 2 and the semiconductor elements 8 are, for example, flip-chip mounted on the mounting board block 100 as shown in FIG. 5A. Specifically, at least a pair of electrically-conductive patterns electrically separated from each other are formed on the mounting board block 100. The p-electrode and the n-electrode (not shown) of each light-emitting element 2 are formed on the same surface, that is, on the surface of the semiconductor layered body 2a, which is opposite to the growth substrate 2b of the light-emitting element 2. Heat, ultrasonic waves, and a load are applied to the p-electrodes and the n-electrodes of the light-emitting elements 2 facing the corresponding electrically-conductive patterns of the mounting board block 100 across the electrically-conductive bonding members, so that the electrically-conductive bonding members 7 and the light-emitting elements 2 are bonded to the electrically-conductive patterns on the mounting board. In mounting, the electrically-conductive bonding members may be disposed on the mounting board block 100 or may be disposed on the light-emitting elements 2 and semiconductor elements 8. The semiconductor elements 8 different from the light-emitting elements 2 are disposed in the present embodiment but can be omitted as appropriate.

Second Step

The reflective film and the phosphor layer are formed on the light-transmissive members. The light -transmissive members may be plate-shaped members. The light-transmissive members corresponding to respective light-emitting elements 2 may be unified.

Specifically, for example, a glass plate made of glass such as borosilicate glass and quartz glass is first provided as the plate-shaped light-transmissive member. The surface roughness Ra of the surface of the light-transmissive member on which the reflective film is to be formed is preferably small, that is, the surface is preferably flat. The surface roughness Ra is, for example, 20 nm or less, preferably 10 nm or less, and more preferably 3 nm or less. The surface of the light-transmissive member on which the reflective film is to be formed is referred to as the upper surface, and the opposite surface may be referred to as the lower surface in the present specification.

Subsequently, the reflective film is formed on the light-transmissive member.

For example, the first dielectric layers and the second dielectric layers having different refractive indices are alternately layered to form the reflective film made of the dielectric multilayer film.

The reflective film made of the dielectric multilayer film can be formed by alternately forming the first dielectric layers and the second dielectric layers by atomic layer deposition (ALD), sputtering, or vapor deposition. Especially, atomic layer deposition (ALD) is preferable.

Forming the reflective film on a smooth surface of a glass plate having a surface roughness Ra of 10 nm or less, preferably 3 nm or less enables, for example, thin first dielectric layers and second dielectric layers each having a thickness of 30 nm to 100 nm to have comparatively less amount of position offset from a geometric plane, that is, to be smooth. Hence, the reflective film that has a high reflectance in the reflection range and a high transmittance in the transmission range is formed.

Subsequently, the phosphor layer 3 is formed on the reflective film 1.

The phosphor layer is formed on the reflective film by, for example, printing. In printing, a paste containing the phosphor, a binder, and a solvent is prepared, applied to the surface of the reflective film, and dried, so that the phosphor layer is formed. Examples of the binder include an organic resin binder such as epoxy resins, silicone resins, phenolic resins, and polyimide resins, or an inorganic binder such as glass.

Instead of printing, the phosphor layer can be formed by compression molding, phosphor electrodeposition, method using a phosphor sheet, or the like. In compression molding, the material for the phosphor layer containing a phosphor in a binder is formed with a mold on the reflective film. In phosphor electrodeposition, a light-transmissive electrically-conductive thin film is formed in advance on the surface of the reflective film, and a charged phosphor is then allowed to deposit on the thin film using electrophoresis. In the phosphor sheet method, a phosphor is mixed and kneaded with a silicone resin, and a phosphor sheet formed into a sheet is fixed to the surface of the reflective film. For example, the phosphor sheet having a thickness of 100 μm or less is compressed and integrated with the surface of the reflective film.

The light-transmissive member on which the reflective film and the phosphor layer are formed is divided into pieces each having a size that is sufficient for each piece to be disposed on the light-emitting surface of each light-emitting element 2. The light-transmissive member 4 on which the reflective film 1 and the phosphor layer 3 are integrated is thus formed. The light-transmissive member 4 including the reflective film 1 and the phosphor layer 3 is referred to as a light-transmissive layered member hereinafter.

The shape of the surface of the phosphor layer 3 in a singulated light-transmissive layered member is preferably slightly larger in plane area than the light-emitting surface of the light-emitting element 2 in consideration of mounting accuracy on the light-emitting surface of the light-emitting element 2. In other words, the phosphor layer 3 is larger in width than the light-emitting surface of the light-emitting element 2 in a sectional view.

Third Step

The light-transmissive layered members are bonded to the light-emitting elements 2 with the adhesive layers 5 with the phosphor layers 3 facing the light-emitting surfaces of the light-emitting elements 2. This bonding produces a plurality of light-transmissive layered members on the mounting board block 100. In a preferable embodiment, since the bonded surface of each light-transmissive layered member to the light-emitting element 2, that is, the bonded surface of the phosphor layer 3 to the light-emitting element 2, has an area larger than the light-emitting surface of the light-emitting element 2, the adhesive protruding from the light-emitting surface of the light-emitting element 2 adheres to the lateral surfaces of the light-emitting element 2 to form a protruding port ion of the adhesive layer, the longitudinal section of which has a substantially triangular shape as shown in FIG. 5B. The protruding portion of the adhesive layer adhering to the lateral surfaces of the light-emitting element 2 has a triangular shape in which the thickness of the layer decreases toward the lower direct ion of the light-emitting element 2.

Fourth Step

In this step, the reflective resin is charged into the gaps between the adjacent light-emitting layered units 20 as shown in FIG. 5C. The reflective resin is intended to reflect the light emitted from the light-emitting elements 2, and is formed to cover the lateral surfaces of the light-emitting layered units 20 except for their upper surfaces and to embed the semiconductor elements 8.

Since the protruding portions adhering to the lateral surfaces of the light-emitting elements 2 each have a triangular sectional shape in which the thickness decreases toward the lower direction of the light-emitting elements 2, the reflective resin covering the lateral surfaces of the light-emitting elements 2 is inclined so as to expand upward.

This structure allows light emitted from the lateral surfaces of the light-emitting elements 2 to be reflected toward the phosphor layer and to excite the phosphor, thereby improving the luminance.

Subsequently, the reflective resin and the mounting board block are cut along cutting lines 9 shown in FIG. 5C and are divided into individual light-emitting devices so that the resulting pieces each include one light-emitting element 2 and one semiconductor element 8.

The light-emitting device in the embodiment shown in FIG. 1 is thus produced.

In the case where the resulting light-emitting device does not include the mounting board, the mounting board may be removed before or after cutting the mounting board block.

In an embodiment described above, the illustrative light-emitting device includes the reflective film 1 between the light-transmissive member 4 and the phosphor, but the light-emitting device in the embodiment may have a structure other than above. The reflective film 1 may be disposed above the light-transmissive member 4, that is, the light-transmissive member 4 may be disposed between the phosphor layer 3 and the reflective film 1. Also in this structure, covering t he entire lateral surfaces of the light-emitting layered unit 20 with the reflective resin 6 reduces emission of the first light emitted from the light-emitting element 2 to the outside, and increases the efficiency of exciting the phosphor.

EXAMPLES

Examples will be described below.

In each of Examples 1 to 3, a light-emitting device shown in FIG. 1 was produced as described below.

A blue light-emitting diode having a peak wavelength of about 445 nm and a dominant wavelength of about 450 nm was used as a light-emitting element 2 and mounted on an aluminum nitride mounting board.

A glass substrate made of glass and having a thickness of 150 μm was used as a light-transmissive member 4. A reflective film 1 made of a dielectric multilayer film (e.g., DBR reflective film) designed to reflect light with wavelengths of 550 nm or less and transmit light with wavelengths of more than 550 nm was formed on the glass substrate.

Specifically, the reflective film 1 was formed by layering 15.5 periods (i.e., 31 layers in total) of first dielectric layers 1a made of $Nb_2O_5$ and second dielectric layers 1b made of $SiO_2$ alternately in this order of a second dielectric layer, a first dielectric layer, a second dielectric layer, and a first dielectric layer on the light-transmissive member 4 by sputtering.

A phosphor layer 3 with a thickness listed in Table 1 was formed by mixing particles of a CASN-based phosphor represented by $CaAlSiN_3$:Eu into a silicone resin so that the weight of the particles in units of wt % was listed in Table 1 and printing the mixture on the reflective film 1. Phosphor particles having an average diameter of 9.5 μm were used in Examples 1 and 2, and phosphor particles having an average diameter of 16.5 μm were used in Example 3.

The light-transmissive member 4 on which the reflective film 1 and the phosphor layer 3 had been formed was singulated, and bonded to the light-emitting element 2 mounted on the mounting board, using a silicone resin. A reflective resin 6 made of a silicone resin containing $TiO_2$ was formed to cover the light-emitting element 2 except for the surface of the light-transmissive member.

In a comparative example, the light-emitting device was formed in substantially the same manner as in the examples except that the phosphor layer 3 was formed directly on the light-transmissive member 4 without the reflective film 1. The comparative example was the same as the Examples 1 and 2 in that particles of the CASN-based phosphor represented by $CaAlSiN_3$:Eu having an average diameter of 9.5 μm were used as the phosphor. The thickness of the phosphor layer 3 was 107 μm.

Table 1 shows light emission characteristics (i.e., color and luminous flux) of the light-emitting devices in Examples 1 to 3 produced as described above as well as the light emission characteristics of the light-emitting device in the comparative example. The luminous flux are shown as relative values assuming the value in the comparative example to be 100.

TABLE 1

| | Phosphor Layer | | | Evaluation of Light-emission Characteristics | | |
|---|---|---|---|---|---|---|
| | Phosphor Content (wt %) | Thickness (μm) | DBR Reflective Film | Color x | y | Luminous Flux Ratio (%) |
| Comparative Example | 65 | 107 | Not exist | 0.694 | 0.294 | 100.0 |
| Example 1 | 65 | 76 | Exist | 0.660 | 0.329 | 240.8 |
| Example 2 | 65 | 97 | Exist | 0.668 | 0.323 | 180.9 |
| Example 3 | 67.5 | 104 | Exist | 0.663 | 0.327 | 220.8 |

As is clear from the results shown in Table 1, the luminous flux of the light-emitting device in any of the Examples 1 to 3 including the DBR reflective film was 1.8 times or more higher than the luminous flux of the light-emitting device of the comparative example not including DBR reflective film, that is, the light-emission efficiency was improved. The light-emitting device of Example 1 with the light-emitting device of Example 2 are compared. This comparison shows that the light-emitting device of Example 1 provided substantially the same color as the light-emitting device of Example 2, and provided a greater luminous flux ratio than in Example 2, even though the thickness of the phosphor layer was small and the absolute quantity of the phosphor contained in the phosphor layer was small in Example 1. These results show that reducing the thickness of the phosphor layer increases the emission intensity without changing the color in a light-emitting device including the reflective film 1.

The light-emitting device of Example 2 and the light-emitting device of Example 3 that had substantially the same thickness of the phosphor layers are compared. This comparison shows that the color tones were substantially the same and the luminous flux ratio was greater in the light-emitting device of Example 3, in which the diameters of the phosphor particles contained in the phosphor layer were larger and the content of the phosphor was somewhat higher. Hence, it is considered that increasing the average diameter of the phosphor particles contained in the phosphor layer enhances the emission intensity of a light-emitting device including the reflective film 1.

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing detailed description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the detailed description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A light-emitting device comprising:
a light-emitting element emitting first light;
a phosphor layer provided on a light-emitting surface of the light-emitting element, the phosphor layer comprising a phosphor being excited by the first light to emit second light with a wavelength longer than a wavelength of the first light;
a reflective film provided on the phosphor layer, the reflective film reflecting the first light and transmitting the second light; and
a light-transmissive member being in contact with the reflective film,
wherein the first light has a peak wavelength in a range of 435 nm to 480 nm and the second light has a wavelength longer than 550 nm, and
wherein, in an emission spectrum of the light-emitting device, an emission peak intensity of the first light emitted from the light-emitting element is $\frac{1}{10}$ or less of an emission peak intensity of the second light.

2. The light-emitting device according to claim 1, wherein, in an emission spectrum of the light-emitting device, an emission peak intensity of the first light is $\frac{1}{30}$ or more of an emission peak intensity of the second light.

3. The light-emitting device according to claim 1, wherein an emission peak wavelength in an emission spectrum of the light-emitting device is substantially equal to an emission peak wavelength of the second light.

4. The light-emitting device according to claim 1, wherein an emission spectrum of the light-emitting device is substantially equal to an emission spectrum of the second light.

5. The light-emitting device according to claim 1, wherein a chromaticity of light emitted from the light-emitting device is within a quadrilateral region formed by connecting four points of (x=0.645, y=0.335), (x=0.665, y=0.335), (x=0.735, y=0.265), and (x=0.721, y=0.259) in an xy chromaticity coordinate system in a CIE 1931 chromaticity diagram, and
wherein an emission intensity of the second light in a range of 555 nm to 600 nm includes a point which is 0.1 times or more as large as the emission peak intensity of the second light.

6. The light-emitting device according to claim 1, wherein the light-transmissive member has a plate shape.

7. The light-emitting device according to claim 1, wherein the light-transmissive member comprises glass.

8. The light-emitting device according to claim 1, the light-emitting device further comprising a reflective member that covers a lateral surface of the light-emitting element, a lateral surface of the phosphor layer, and a lateral surface of the reflective film.

9. The light-emitting device according to claim 1, wherein the reflective film comprises a dielectric multilayer film.

10. The light-emitting device according to claim 1, wherein the phosphor layer has a width larger than a width of the light-emitting surface of the light-emitting element in a sectional view.

11. The light-emitting device according to claim 1, wherein the phosphor layer is made of a light-transmissive resin containing phosphor particles.

12. The light-emitting device according to claim 1, wherein the phosphor layer has a thickness between 30 and 150 μm.

13. The light-emitting device according to claim 1, wherein the phosphor comprises a nitride phosphor.

14. The light-emitting device according to claim 1, wherein the phosphor layer is disposed on the light-emitting element with an adhesive layer sandwiched therebetween.

15. The light-emitting device according to claim 14, wherein the adhesive layer covers side surfaces of the light-emitting element.

* * * * *